(12) United States Patent
Ji

(10) Patent No.: US 12,224,039 B2
(45) Date of Patent: Feb. 11, 2025

(54) ADDRESS SIGNAL TRANSMISSION CIRCUIT, ADDRESS SIGNAL TRANSMISSION METHOD AND STORAGE SYSTEM

(71) Applicant: CHANGXIN MEMORY TECHNOLOGIES, INC., Hefei (CN)

(72) Inventor: Kangling Ji, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 164 days.

(21) Appl. No.: 18/163,323

(22) Filed: Feb. 2, 2023

(65) Prior Publication Data

US 2024/0046972 A1 Feb. 8, 2024

Related U.S. Application Data

(63) Continuation of application No. PCT/CN2022/116645, filed on Sep. 1, 2022.

(30) Foreign Application Priority Data

Aug. 5, 2022 (CN) .......................... 202210940310.6

(51) Int. Cl.
*G11C 8/18* (2006.01)
*G11C 8/10* (2006.01)
*G11C 8/12* (2006.01)

(52) U.S. Cl.
CPC .................. *G11C 8/18* (2013.01); *G11C 8/10* (2013.01); *G11C 8/12* (2013.01)

(58) Field of Classification Search
CPC ................ G11C 8/18; G11C 8/10; G11C 8/12
See application file for complete search history.

(56) References Cited

U.S. PATENT DOCUMENTS 9,997,234 B1 6/2018 Kim et al.
2002/0036533 A1 3/2002 Okajima
(Continued)

FOREIGN PATENT DOCUMENTS

CN 103514934 A 1/2014
CN 104657279 A 5/2015
(Continued)

OTHER PUBLICATIONS

Extended European search report in application No. 22924597, mailed on Sep. 18, 2024.

*Primary Examiner* — Han Yang
(74) *Attorney, Agent, or Firm* — Syncoda LLC; Feng Ma

(57) ABSTRACT

An address signal transmission circuit includes a transmission control circuit, connected to an address bus, configured to receive address signals from the address bus, acquire a first address signal and a second address signal, and generate and output an inversion flag signal based on the first address signal and the second address signal, where the first address signal is an address signal received in a previous time and the second address signal is a currently received address signal; and a selection circuit, connected to the address bus, configured to receive the address signals from the address bus, determine, in response to the inversion flag signal, whether the second address signal is to be inverted, and correspondingly output one of the second address signal or an address inverted signal, where the selection circuit inverts the second address signal to obtain the address inverted signal.

20 Claims, 11 Drawing Sheets

(56) References Cited

U.S. PATENT DOCUMENTS

| | | |
|---|---|---|
| 2004/0168012 A1 | 8/2004 | Tsai |
| 2005/0213420 A1 | 9/2005 | Im |
| 2009/0116330 A1 | 5/2009 | Yang |
| 2010/0202242 A1 | 8/2010 | Yang |
| 2013/0111102 A1* | 5/2013 | Kim .................... G11C 7/1006 711/E12.001 |
| 2015/0143028 A1 | 5/2015 | Jung et al. |
| 2015/0179269 A1 | 6/2015 | Lee |
| 2016/0099043 A1* | 4/2016 | Tu .................... G11C 11/40615 365/222 |
| 2017/0109308 A1* | 4/2017 | Kim .................... G06F 13/161 |
| 2018/0130507 A1 | 5/2018 | Kim et al. |
| 2021/0247927 A1 | 8/2021 | Zhang |
| 2022/0065928 A1 | 3/2022 | Heldeis et al. |

FOREIGN PATENT DOCUMENTS

| | | |
|---|---|---|
| CN | 108346444 A | 7/2018 |
| CN | 110413544 A | 11/2019 |
| CN | 210667806 U | 6/2020 |
| CN | 114822633 A | 7/2022 |
| TW | 200416531 A | 9/2004 |
| TW | 202046126 A | 12/2020 |

* cited by examiner

ADDRESS SIGNAL TRANSMISSION CIRCUIT, ADDRESS SIGNAL TRANSMISSION METHOD AND STORAGE SYSTEM

CROSS-REFERENCE TO RELATED APPLICATIONS

This application is a continuation of International Application No. PCT/CN2022/116645 filed on Sep. 1, 2022, which claims priority to Chinese Patent Application No. 202210940310.6 filed on Aug. 5, 2022. The disclosures of these applications are hereby incorporated by reference in their entireties.

BACKGROUND

Semiconductor memories include a Static Random-Access Memory (SRAM), a Dynamic Random Access Memory (DRAM), a Synchronous Dynamic Random Access Memory (SDRAM), a Read Only Memory (ROM), a flash memory and the like.

In a DRAM protocol of a Joint Electron Device Engineering Council (JEDEC), specific requirements are put on speed and power saving of DRAM. How to guarantee the integrity of signals and the reliability of data/address transmission while enabling the DRAM to be more power saving is one of the problems that have to be settled urgently in industry.

SUMMARY

Embodiments of the disclosure relate to the technical field of semiconductors, particularly to an address signal transmission circuit, an address signal transmission method and a storage system, which at least contributes to reducing the power consumption of address signal transmission.

According to a first aspect, the embodiments of the disclosure provide an address signal transmission circuit, which may include a transmission control circuit, connected to an address bus, configured to receive address signals from the address bus, acquire a first address signal and a second address signal, and generate and output an inversion flag signal based on the first address signal and the second address signal; the first address signal is an address signal received in a previous time and the second address signal is a currently received address signal; and a selection circuit, connected to the address bus, configured to receive the address signals from the address bus, determine, in response to the inversion flag signal, whether the second address signal is to be inverted, and correspondingly output one of the second address signal or an address inverted signal; the selection circuit inverts the second address signal to obtain the address inverted signal.

According to a second aspect, the embodiments of the disclosure provide an address signal transmission method, which may include: receiving an address bus, acquiring a first address signal and a second address signal, and generating and outputting an inversion flag signal based on the first address signal and the second address signal; the first address signal is an address signal received in a previous time and the second address signal is a currently received address signal; and in response to the inversion flag signal, determining whether the second address signal is to be inverted, and correspondingly outputting one of the second address signal or an address inverted signal; the address inverted signal is obtained by inverting the second address signal.

According to a third aspect, the embodiments of the disclosure further provide a storage system, which may include an address signal transmission circuit. The address signal transmission circuit may include: a transmission control circuit, connected to an address bus, configured to receive address signals from the address bus, acquire a first address signal and a second address signal, and generate and output an inversion flag signal based on the first address signal and the second address signal, wherein the first address signal is an address signal received in a previous time and the second address signal is a currently received address signal; and a selection circuit, connected to the address bus, configured to receive the address signals from the address bus, determine, in response to the inversion flag signal, whether the second address signal is to be inverted, and correspondingly output one of the second address signal or an address inverted signal, wherein the selection circuit inverts the second address signal to obtain the address inverted signal.

BRIEF DESCRIPTION OF THE DRAWINGS

One or more examples are exemplarily described with the pictures in the corresponding accompanying drawings, and these exemplary descriptions do not form limits to the examples. The elements with the same reference sign numbers in the accompanying drawings represent similar elements. Unless otherwise specified, the pictures in the accompanying drawings do not form scale limits. To describe the technical solution in the embodiments or traditional art more clearly, the accompanying drawings needed to be used in the examples are briefly introduced below. It is apparent that the accompanying drawings described below are merely some examples of the disclosure. Those of ordinary skill in the art may further obtain other accompanying drawings according to these accompanying drawings without creative efforts.

DETAILED DESCRIPTION

In a technical solution of the address signal transmission circuit provided by the embodiments of the disclosure, the inversion flag signal is generated based on the address signal (i.e., the first address signal) received in the previous time and the currently received address signal (i.e., the second address signal), in response to the inversion flag signal, whether the second address signal is to be inverted, and the second address signal or the address inverted signal is correspondingly outputted. The address inverted signal is obtained by inverting the second address signal. In the embodiments of the disclosure, the inversion flag signal may be generated based on the first address signal and the second address signal according to different performance requirements of the transmission address signal, so as to flexibly choose to directly output the second address signal or invert the second address signal to obtain the address inverted signal and then output the address inverted signal. In such a manner, different requirements on power saving, low power consumption, high transmission speed, high signal integrity and the like in address signal transmission may be satisfied.

In addition, in some embodiments, in a case where the number of changed bits of the address data in the address signals transmitted successively by the address bus is greater than or equal to the predetermined value, the address data in the currently received address signal is reversed to obtain the address inverted signal. Most address data in the address inverted signal is the same with the address data in the address signal transmitted in the previous time. In such a manner, most circuits in the signal transmission circuit may be kept in the state in transmission in the previous time without being inverted, so that the transmission power consumption of the address signal transmission sub-circuit may be effectively saved.

Figure 1:
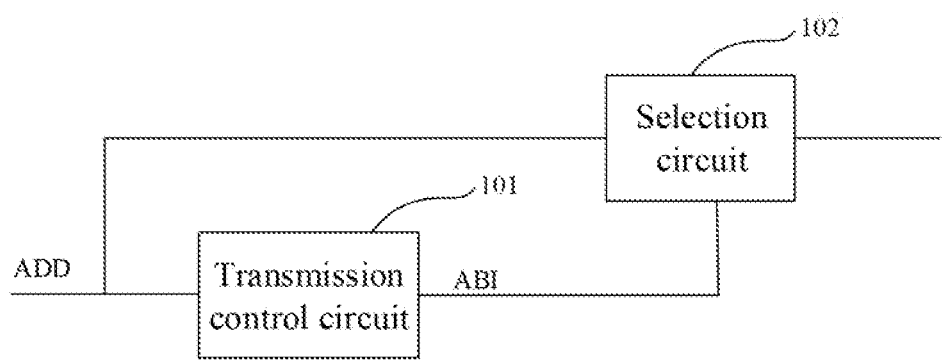
FIG. 1 is a block diagram of an address signal transmission circuit according to an embodiment of the disclosure.

FIG. 1 is a block diagram of an address signal transmission circuit according to an embodiment of the disclosure.

Referring to FIG. 1, the address signal transmission circuit provided by the embodiments of the disclosure includes a transmission control circuit 101, connected to an address bus ADD, configured to receive address signals from the address bus ADD, acquire a first address signal and a second address signal, and generate and output an inversion flag signal ABI based on the first address signal and the second address signal, where the first address signal is an address signal received in a previous time and the second address signal is a currently received address signal; and a selection circuit 102, connected to the address bus ADD, configured to receive the address signals from the address bus ADD, determine, in response to the inversion flag signal ABI, whether the second address signal is to be inverted, and correspondingly output one of the second address signal or an address inverted signal; the selection circuit 102 inverts the second address signal to obtain the address inverted signal.

Specifically, in a case where the selection circuit 102, in response to the inversion flag signal ABI, inverts the second address signal to obtain the address inverted signal, the selection circuit 102 correspondingly outputs the address inverted signal; in a case where the selection circuit 102, in response to the inversion flag signal ABI, does not invert the second address signal, the selection circuit 102 directly outputs the second address signal correspondingly. In the embodiments of the disclosure, the inversion flag signal ABI may be generated based on the address signal (i.e., the first address signal) received in the previous time and the currently received address signal (i.e., the second address signal), and the inversion flag signal ABI is configured to control the selection circuit 102 to either directly output the second address signal or invert the second address signal to obtain the address inverted signal and then output the address inverted signal. In such a manner, valid or invalid inversion flag signal ABI may be flexibly generated according to the address signals transmitted successively, in response to the valid inversion flag signal ABI, the currently transmitted address signal is reserved to obtain the address inverted signal and is continuously transmitted, and in response to the invalid inversion flag signal ABI, the second address signal is directly continued to satisfy different transmission requirements on the address signal transmission circuit, for example, small power consumption required by the address signal transmission circuit to transmit the address signals, high transmission rate or high transmission accuracy and the like.

In some embodiments, the transmission control circuit 101 may generate the inversion flag signal ABI based on a difference between the first address signal and the second address signal. The difference may be the number of changed bits of the address data in the first address signal and the second address signal. Correspondingly, the transmission control circuit 101 may further be configured to acquire the number of changed bits of the address data in the first address signal and the second address signal, and to generate the inversion flag signal ABI based on a relation between the number of changed bits and a predetermined value. Correspondingly, the selection circuit 102 is further configured to, in a case where the number of changed bits is greater than or equal to the predetermined value, invert the second address signal to obtain the address inverted signal and output the address inverted signal, and in a case where the number of changed bits is smaller than the predetermined value, to directly output the second address signal. A bit number of the address data in the address signal is N, and the predetermined value satisfies: $M=N/2+1$, M being the predetermined value and N being a positive integer.

In a case where the number of changed bits is greater than or equal to the predetermined value, and the second address signal is not inverted but is directly transmitted, most circuits in the address signal transmission sub-circuit that transmits the address signal need to be inverted, so as to guarantee that the circuit which transmits "0" in the previous time is turned into the circuit which currently transmits "1" in the address signal transmission sub-circuit or the circuit which transmits "1" in the previous time is turned into the circuit which currently transmits "0" in the address signal transmission sub-circuit. Thus, the address signal transmission sub-circuit would consume relatively high power consumption. It is to be understood that the aforementioned "0" refers to the address data in the address signal, which is low level data, and the aforementioned "1" refers to the address data in the address signal, which is high level data. The address signal transmission sub-circuit includes multiple gate level circuits and a driving circuit. In a case where the address data transmitted successively by the address signal transmission sub-circuit changes, i.e., it changes between the low level data and the high level data, all gate level circuits and driving circuit in the address signal transmission sub-circuit all may need level inversion so as to generate a relatively large inversion current and power consumption. In the embodiments of the disclosure, in a case where the number of changed bits is greater than or equal to the predetermined value, the address data in the second address signal is reversed to obtain the address inverted signal. Most address data in the address inverted signal is the same with the address data in the first address signal. In such a manner, most circuits in the signal transmission circuit may be kept in the state in transmission in the previous time without being inverted so as to reduce the inversion current as much as possible, so that the transmission power consumption of the address signal transmission sub-circuit may be effectively saved.

The address signal transmission circuit provided by the embodiments of the disclosure will be described in detail below in combination with the accompanying drawings.

The address signal transmission circuit may be applied to a storage system. In some embodiments, the storage system may be a Dynamic Random Access Memory (DRAM) storage system. In some other embodiments, the storage system may further be a Static Random Access Memory (SRAM) storage system, a Synchronous Dynamic Random Access Memory (SDRAM) storage system, a read only memory (ROM) storage system or a flash memory storage system.

The storage system includes a plurality of memory cell arrays. Each of the memory cell arrays may include a plurality of storage areas. Each of the storage areas may include 2X word lines. Each of the memory cell arrays may include 2Y bit lines. The address signal transmitted by the address bus ADD may represent a storage area (BANK) address, a row address (ROW_ADD) or a column address (COL_ADD), that is to say, the storage area for performing store operation may be indicated by the address signal, the selected row address (i.e., selected word line) may be indicated by the address signal, and the selected column address (i.e., selected bit line) may be indicated by the address signal.

The bit number of the address data in the address signal is N. It is to be understood that N is determined by a specific address signal represented by the address signal. Correspondingly, in a case where N changes, the predetermined value M changes along with change of N, satisfying M=N/2+1.

Specifically, in some embodiments, the address signal transmitted by the address bus ADD represents the storage area address. By taking the memory cell array including four storage areas as an example, bit number of the address data in the address signal transmitted by the address bus ADD is 2. For example, in a case where the address signal transmitted by the address bus ADD is set as "00", the first storage area is selected for performing store operation. In a case where the address signal transmitted by the address bus ADD is set as "01", the second storage area is selected for performing store operation. In a case where the address signal transmitted by the address bus ADD is set as "10", the third storage area is selected for performing store operation. In a case where the address signal transmitted by the address bus ADD is set as "11", the fourth storage area is selected for performing store operation. By taking the memory cell array including 8 storage areas as an example, the bit number of the address data in the address signal transmitted by the address bus ADD is 3. By taking the memory cell array including 64 storage areas as an example, the bit number of the address data in the address signal transmitted by the address bus ADD is 6.

In some embodiments, the address signal transmitted by the address bus ADD represents the row address. Each of the storage areas includes 2X word lines. Therefore, it is indicated that the bit number of the address data in the address signal of the selected word line may be X. In some other embodiments, the address signal transmitted by the address bus ADD represents the column address. Each of the storage areas includes 2Y word lines. Therefore, it is indicated that the bit number of the address data in the address signal of the selected bit line may be Y.

The transmission control circuit 101 is configured to generate the inversion flag signal ABI which is a pulse signal, that is, the inversion flag signal ABI has the first level and the second level. The inversion flag signal ABI at a same time only has one of the first level or the second level, and the first level is different from the second level. The inversion flag signal ABI having the first level is valid, and the inversion flag signal ABI having the second level is invalid. In a case where the inversion flag signal ABI is valid, the selection circuit 102, in response to the valid inversion flag signal ABI, inverts the second address signal to obtain the address inverted signal. In a case where the inversion flag signal ABI is invalid, the selection circuit 102 receives the invalid inversion flag signal ABI and the second address signal and outputs the second address signal. It is to be understood that ABI refers to Address Bus Inversion.

Specifically, in some embodiments, the first level may be a high level and the second level may a low level. It is to be understood that "high" and "low" herein are comparatively relative. Correspondingly, the inversion flag signal ABI is the high level valid signal, i.e., the inversion flag signal ABI is "1", which is valid, and the inversion flag signal ABI is "0", which is invalid. In some other embodiments, the first level may be a low level and the second level may be a high level. Correspondingly, the inversion flag signal ABI is the low level valid signal, i.e., the inversion flag signal ABI is "0", which is valid, and the inversion flag signal ABI is "1", which is invalid. It is to be understood that the inversion flag signal ABI may be selected as the high level valid signal or the low level valid signal according to an actual circuit design, guaranteeing that the inversion flag signal ABI is valid in a period when the number of changed bits is greater than or equal to the predetermined value, i.e., guaranteeing that the selection circuit 102, in response to the valid inversion flag signal ABI, inverts the currently received address signal to obtain the address inverted signal in the period when the number of changed bits is greater than or equal to the predetermined value.

Figure 2:
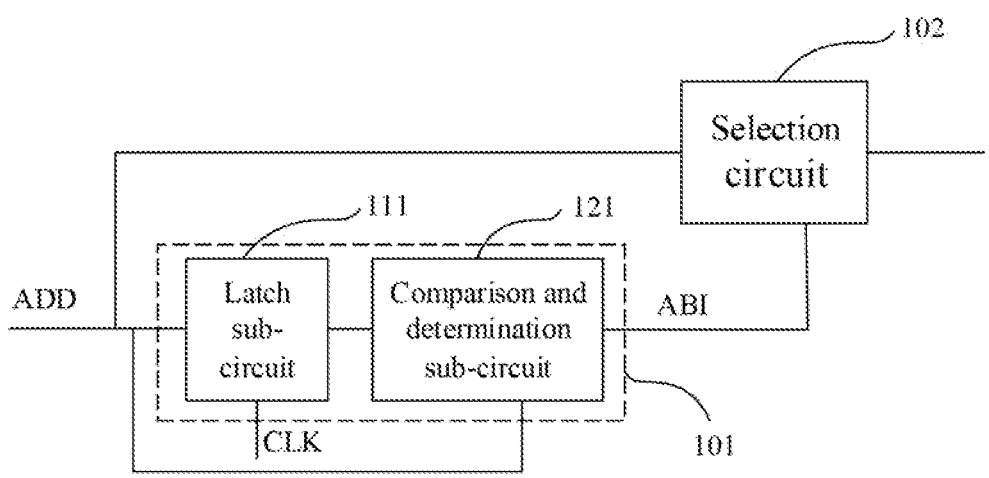
FIG. 2 to FIG. 4 are several different block diagrams of an address signal transmission circuit according to embodiments of the disclosure.
Figure 3:
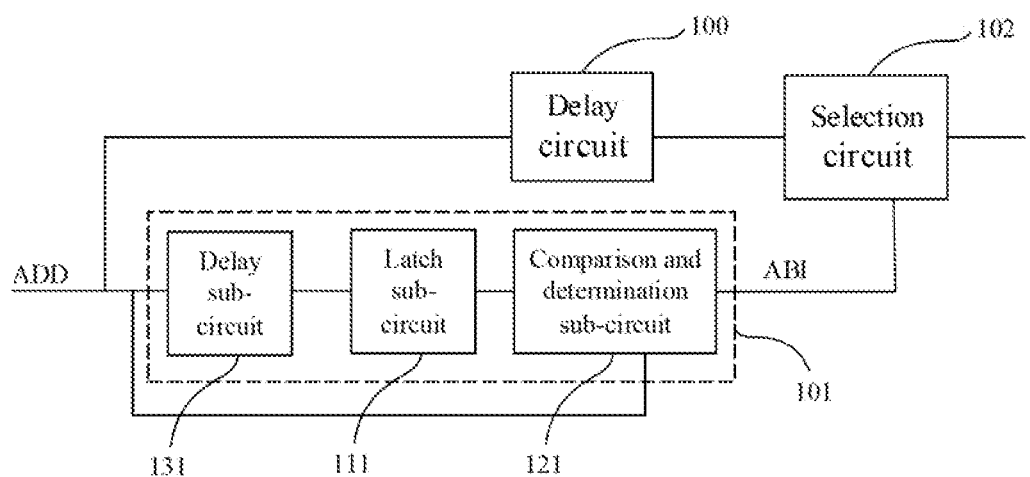
Figure 4:
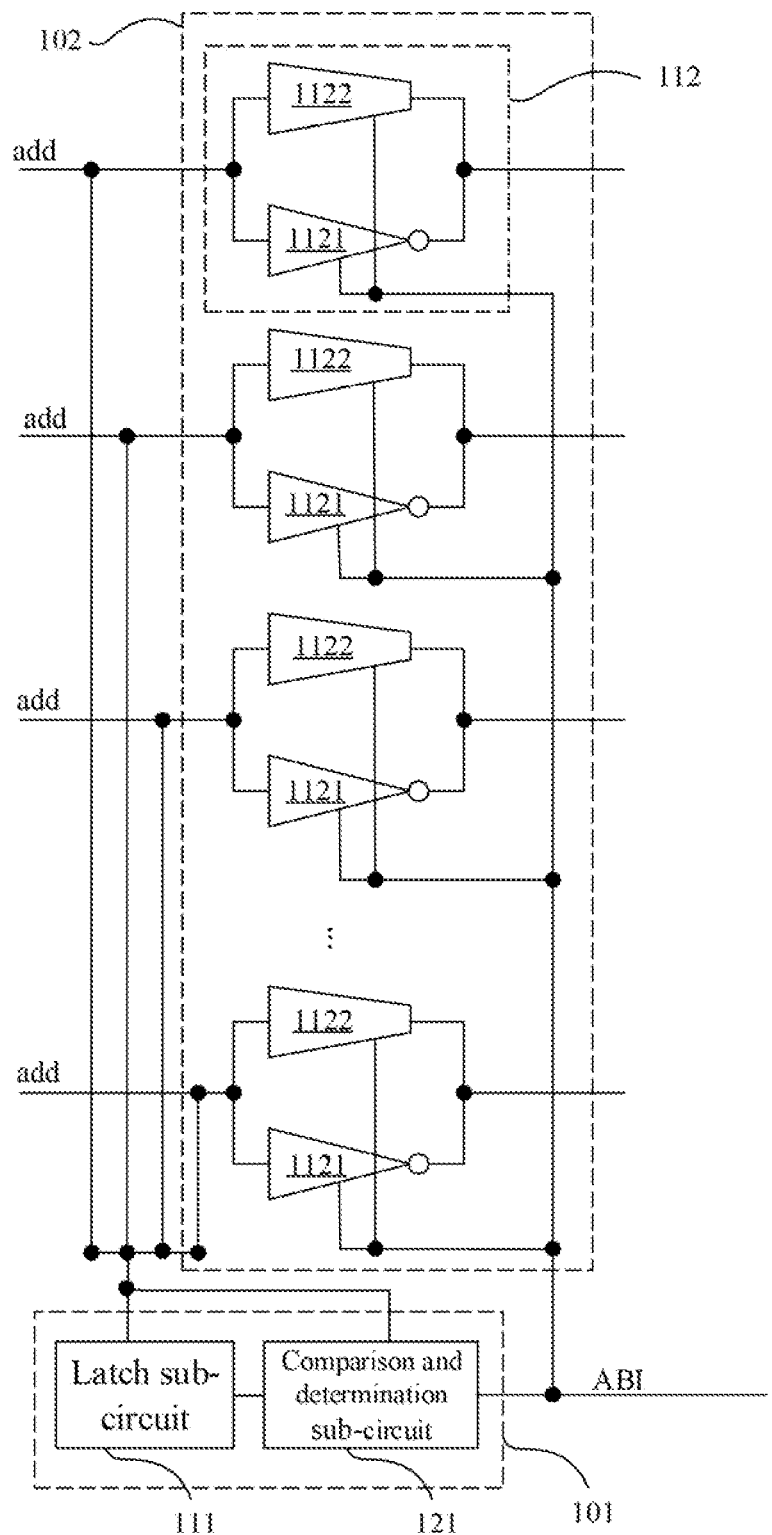

FIG. 2 to FIG. 4 are several different block diagrams of an address signal transmission circuit according to embodiments of the disclosure. Referring to FIG. 2 to FIG. 4, in some embodiments, the transmission control circuit 101 may include: a latch sub-circuit 111, connected to the address bus ADD to latch and output the received address signal; and a comparison and determination sub-circuit 121, connected to the address bus ADD to acquire the second address signal, connected to the latch sub-circuit 111 to acquire the first address signal latched in the previous time, where the comparison and determination sub-circuit 121 is configured to acquire the number of changed bits according to the first address signal and the second address signal, and compare the number of changed bits with the predetermined value to generate the inversion flag signal ABI. It is to be understood that the latch sub-circuit 111 latches the address signal transmitted every time. For the address signal currently transmitted by the address bus ADD, the comparison and determination sub-circuit 121 receives the second address signal from the address bus ADD, and the address signal, i.e., the first address signal, latched by the latch sub-circuit 111 in the previous time would be outputted to the comparison and determination sub-circuit 121.

The address data of each bit in the address signal is transmitted to the transmission control circuit 101 and the selection circuit 102 in a parallel transmission mode. For example, the first address signal is transmitted to the transmission control circuit 101 in parallel transmission mode, and the first address signal may be transmitted to the latch sub-circuit 111 in a parallel transmission mode. The second address signal is transmitted to the transmission control circuit 101 and the selection circuit 102 in a parallel transmission mode, and the second address signal may be transmitted to the comparison and determination sub-circuit 121 and the selection circuit 102 in a parallel transmission mode. Specifically, the address bus ADD includes a plurality of address wires add. The quantity of the address wires add is kept consistent with that of the bits of the address data in the address signal, i.e., the address bus ADD includes N address wires add, and each of the address wires add transmits single-bit address data in the address signal. The address wires add all are connected to the selection circuit 102 and are connected to the latch sub-circuit 111 in the transmission control circuit 101.

The latch sub-circuit 111 is connected to all the address wires add and latches the single-bit address data transmitted in the previous time by the corresponding address wires. The comparison and determination sub-circuit 121 is connected to all the address wires add and receives the single-bit address data currently transmitted by the corresponding address wires add, and the latch sub-circuit 111 would further transmit the single-bit address data transmitted in the previous time by the address wires add to the comparison and determination sub-circuit 121, such that the comparison and determination sub-circuit 121 compares whether the single-bit address data currently transmitted by the corresponding address wires add and the single-bit address data transmitted in the previous time by the corresponding address wires add change.

It is to be understood that whether the currently transmitted single-bit address data and the single-bit address data transmitted in the previous time change may either refer to that the single-bit address data transmitted in the previous time is "0" and the currently transmitted single-bit address data is "1" or refers to that the single-bit address data transmitted in the previous time is "1" and the currently transmitted single-bit address data is "0". In other words, the currently transmitted single-bit address data and the single-bit address data transmitted in the previous time change, which may be understood that the address data is turned from the high level to the low level or from the low level to the high level.

In some embodiments, referring to FIG. 2, the latch sub-circuit 111 may include a register. A clock control end of the register receives a clock signal CLK, and the register is connected to the address bus ADD to, in response to a trigger edge of the clock signal CLK, latch and output the received address signal. The register may be a D flip-flop, the trigger edge of the clock signal CLK may be a rising edge or a falling edge of the clock signal CLK, and the latch sub-circuit 111 is controlled by the clock signal CLK to latch and output the received address signal. It is to be understood that for a time corresponding to the address signal currently transmitted by the address bus ADD, the latch sub-circuit 111 is controlled by the clock signal CLK to output the first address signal to the comparison and determination sub-circuit 121.

In some other embodiments, referring to FIG. 4, the latch sub-circuit 111 may include a latch, configured to latch and output the received address signal. Correspondingly, the transmission control circuit 101 may further include a delay sub-circuit 131, connected between the address bus add and the latch, and configured to control a time when the address signal on the address bus is transmitted to the latch. Effects of the delay sub-circuit 131 include performing delay processing on the address signal from the address bus ADD, such that the latch sub-circuit 111 may output the address signal latched in the previous time, i.e., latch and output the first address signal.

After acquiring the number of changed bits, the comparison and determination sub-circuit 121 compares the number of changed bits with the predetermined value, so as to generate the inversion flag signal. Specifically, in a case where the number of changed bits is greater than or equal to N/2+1, the comparison and determination sub-circuit 121 generates the inversion flag signal ABI having the first level, and the inversion flag signal ABI having the first level is the valid inversion flag signal ABI; and in a case where the number of changed bits is smaller than N/2+1, the comparison and determination sub-circuit 121 generates the inversion flag signal ABI having the second level, and the inversion flag signal ABI having the second level is the invalid inversion flag signal ABI. For example, the bit number of the address data in the address signal is 6, and in a case where the number of changed bits is greater than or equal to 4, the valid inversion flag signal ABI is generated; and in a case where the number of changed bits is smaller than 4, the invalid inversion flag signal ABI is generated. For example, in a case where the first address signal is "111000", the second address signal is "110111" and the corresponding number of changed bits is 4, the inversion flag signal ABI having the first level is generated; and in a case where the first address signal is "111000", the second address signal is "111011" and the corresponding number of changed bits is 2, the inversion flag signal ABI having the second level is generated.

In some embodiments, the comparison and determination sub-circuit 121 may include a first comparison sub-circuit 10, connected to the address bus ADD and the latch sub-circuit 111, and configured to acquire the number of changed bits; and a second comparison sub-circuit 20, connected to the first comparison sub-circuit 10, and configured to receive the number of changed bits and compare the number of changed bits with the predetermined value, and generate the inversion flag signal ABI. The first comparison sub-circuit 10 receives the first address signal outputted by the latch sub-circuit 111, receives the second address signal from the address bus ADD, and compares the number of changed bits of the address data in the first address signal and the second address signal. The first comparison sub-circuit 10 may be a counter. An initial count value of the counter is 0. In a case where the single-bit address data transmitted in the previous time by each of the address wires add is different from the currently transmitted single-bit address data, the count value of the counter is added with 1, changes of the single-bit address data outputted by all the address wires add are reflected to the count values of the counter, and the final count value of the counter is the number of changed bits. It is to be understood that the predetermined value may be pre-stored in the second comparison sub-circuit 20, and the predetermined value may further be provided by an extra register to the second comparison sub-circuit 20. In addition, since the bit numbers of address data in the address signal are different, the corresponding predetermined values are also different. For example, the bit number of the address signal representing the row address may be different from the bit number of the address signal representing the column address, such that the corresponding predetermined values are also different. In some embodiments, the latch sub-circuit 111 may, in response to the first control clock, output the first address signal to the comparison and determination sub-circuit 121. The address bus ADD may, in response to the second control clock, provide the second address signal to the comparison and determination sub-circuit 121. The first control clock and the second control clock may be the same clock signal.

In some embodiments, prior to receiving the second address signal, the selection circuit 102 receives the inversion flag signal ABI. Thus, prior to receiving the second address signal, the selection circuit 102 first performs corresponding operation based on the inversion flag signal ABI, for example, in response to the valid inversion flag signal ABI, configures a reversal function, such that the second address signal is inverted, and in response to the invalid inversion flag signal ABI, configures a transmission function, such that the second address signal is directly outputted. Referring to FIG. 4, the address signal transmission circuit may further include: a delay circuit 100, the delay circuit 100 being connected between the selection circuit 102 and the address bus ADD to delay the second address signal transmitted to the selection circuit 102. The delay circuit 100 plays a role of buffering the circuit and may include an even number of series-wound inverters. The delay circuit 100 is arranged to contribute to guaranteeing that before the second address signal arrives at the selection circuit 102, the selection circuit 102 has received the inversion flag signal ABI, such that misoperation of the selection circuit 102 on the second address signal is effectively avoided, and the second address signal is prevented from being processed by the selection circuit 102 in a manner that the first address signal is processed, so as to guarantee that the selection circuit 102 may, in response to the corresponding inversion flag signals ABI, performs correct operations on the address signals received at different times, thereby improving the address signal transmission accuracy is improved.

Specifically, by taking a situation that the processing mode of the selection circuit 102 to the first address signal is inverting the first address signal as an example, i.e., the inversion flag signal ABI in the previous time corresponding to the first address signal is valid, in a case where the second address signal is pre-transmitted to the selection circuit 102 and the current inversion flag signal ABI corresponding to the second address signal is then transmitted to the selection circuit 102, the selection circuit 102 still, in response to the inversion flag signal ABI in the previous time, inverts the second address signal. Under such a circumstance, in a case where the current inversion flag signal ABI is invalid, the selection circuit 102 has a misoperation that inverts the second address signal which should not be inverted.

In some other embodiments, the time when the second address signal is received by the selection circuit 102 may be controlled by means of the enable control signal. Thus, the address signal transmission circuit may not be provided with the delay circuit. Specifically, the selection circuit 102 may, in response to the first enable control signal, receive the second address signal. Under a condition that the first enable control signal is valid, the selection circuit 102 would receive the second address signal. In this way, the time when the second address signal is transmitted to the selection circuit 102 may be controlled. Thus, it is guaranteed that the selection circuit 101 successively receives the corresponding to the inversion flag signal ABI corresponding to the second address signal and the corresponding second address signal successively, thereby contributing to further guarantee the correctness of address signal transmission. As previously mentioned, the selection circuit 102, in response to the inversion flag signal ABI having the first level, reveres the second address signal to obtain the address inverted signal and output the address inverted signal. The selection circuit 102, in response to the inversion flag signal ABI having the second level, directly outputs the second address signal. In a case where the number of changed bits is greater than or equal to the predetermined value, the selection circuit reverses all the address data in the second address signal to obtain the address inverted signal, and in a case where the number of changed bits is smaller than the predetermined value, the selection circuit 102 directly transmits the second address signal.

Referring to FIG. 3, the selection circuit 102 may include: N selection sub-circuits 112, each of the selection sub-circuits 112 is connected to the transmission control circuit 101, each of the selection sub-circuits 112 receives the single-bit address data in the second address signal, and each of the selection sub-circuits 112, in response to the inversion flag signal ABI, determines whether the single-bit address data in the second address signal is inverted. The "corresponding" herein refers to that the selection sub-circuit 112 corresponds to the single-bit address data received by the selection sub-circuit 112.

Specifically, each of the selection sub-circuit 112 is connected to an address wire add in the address bus ADD (referring to FIG. 2) to receive the single-bit address data in the address signal transmitted by the address wire add. For example, the address signal transmitted by the address bus ADD is D<7:0>, i.e., the bit number of the address data in the address signal is 8. In a case where the number of the address wires add with changed address data transmitted successively by 8 address wires is greater than or equal to 5, the transmission control circuit 101 outputs the valid inversion flag signal ABI, and each of the selection sub-circuits 112 in the selection circuit 102 receives the single-bit address data in the current 8-bit address signal <7:0>and reverses each bit address data in the 8-bit address signal, i.e. invert the address to obtain the address inverted signal. In a case where the number of the address wires add with changed address data transmitted successively by 8 address wires add is smaller than 5, the transmission control circuit 101 outputs the invalid inversion flag signal ABI, and each of the selection sub-circuits 112 in the selection circuit 102 receives the single-bit address data in the current 8-bit address signal <7:0>and respectively outputs the single-bit address data in the 8-bit address signal.

Referring to FIG. 3, each of the selection sub-circuits 112 may include: a first inversion sub-circuit 1121, configured to receive the corresponding single-bit address data in the second address signal, and in response to the inversion flag signal ABI having the first level, invert the single-bit address data to obtain single-bit address inverted data, and output the single-bit address inverted data, the single-bit address inverted data being used for forming the address inverted signal; and a first transmission sub-circuit 1122, configured to receive the single-bit address data, and in response to the inversion flag signal ABI having the second level, output the single-bit address data.

The input end of the first inversion sub-circuit 1121 is connected to an address wire add, the control end is connected to the transmission control circuit 101 to receive the inversion flag signal ABI, and during a period when the inversion flag signal ABI is valid, i.e., the inversion flag signal ABI has the first level, the first inversion sub-circuit 112 inverts the received single-bit address data, i.e., reverses the single-bit address data to obtain the single-bit address inverted data. The single-bit address inverted data outputted by all the first inversion sub-circuits 1121 jointly form the address inverted signal. During a period when the inversion flag signal ABI is invalid, the first inversion sub-circuit 112 is turned off. The input end of the first transmission sub-circuit 1122 and the input end of the first inversion sub-circuit 1121 are connected to a same address wire add, the control end of the first transmission sub-circuit 1122 is connected to the transmission control circuit 101 to receive the inversion flag signal ABI, and during a period when the inversion flag signal ABI is valid, i.e., the inversion flag signal ABI has the second level, the first transmission sub-circuit 1122 outputs the single-bit address data from the address wire add. During a period when the inversion flag signal ABI is invalid, i.e., when the inversion flag signal ABI has the first level, the first transmission sub-circuit 1122 is turned off.

Figure 5:
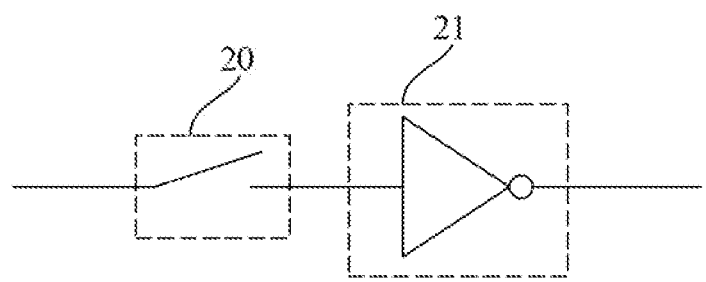
FIG. 5 is a schematic diagram of a circuit structure of a first inversion sub-circuit in an address signal transmission circuit according to embodiments of the disclosure.

FIG. 5 is a schematic diagram of a circuit structure of a first inversion sub-circuit. In some embodiments, in combination with FIG. 3 and FIG. 5, the first inversion sub-circuit 1121 may further include: a first switch 20 and a first inverter 21. The first switch 20 is connected between the address bus ADD and the input end of the first inverter 21, the first switch 20 is turned on in response to the inversion flag signal ABI having the first level, and the first switch 20 is turned off in response to the inversion flag signal ABI having the second level. Specifically, the first switch 20 is connected to one address wire add in the address bus ADD. The first switch 20 is connected between the address wire add and the first inverter 21. Thus, during the period when the inversion flag signal ABI is invalid, the first inverter 21 does not work, which contributes to reducing the power consumption. The first switch 20 may include an N-channel metal oxide semiconductor (NMOS) tube or a P-channel metal oxide semiconductor (PMOS) tube.

Figure 6:
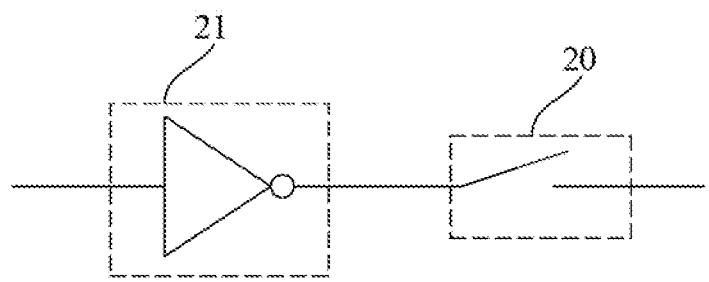
FIG. 6 is another schematic diagram of a circuit structure of a first inversion sub-circuit in an address signal transmission circuit according to an embodiment of the disclosure.

FIG. 6 is another schematic structural diagram of a circuit of a first inversion sub-circuit. In some other embodiments, in combination with FIG. 3 and FIG. 6, the first inversion sub-circuit 1121 may include: the first switch 20 and the first inverter 21. The first switch 20 is connected to the output end of the first inverter 21, and the input end of the first inverter 21 is connected to address bus ADD. The first switch 20 is turned on in response to the inversion flag signal ABI having the first level, and is turned off in response to the inversion flag signal ABI having the second level. Specifically, the first switch 20 is connected to one address wire add in the address bus ADD.

It is to be understood that in other embodiments, the first inversion sub-circuit may further be composed of other proper circuits by only satisfying a condition that the received single-bit address data is reversed in the period when the inversion flag signal is valid and the first inversion sub-circuit does not work in the period when the inversion flag signal is invalid.

In some embodiments, the first transmission sub-circuit 1122 may include: a first transmission gate, an input end of the first transmission gate receiving the single-bit address data, and a control end thereof receiving the inversion flag signal ABI; the first transmission gate being turned off in response to the inversion flag signal ABI having the first level, and being turned on in responses to the inversion flag signal ABI having the second level, so as to output the single-bit address data.

It is to be understood that in other embodiments, the first transmission sub-circuit may further be composed of other proper circuits by only satisfying a condition that the first transmission sub-circuit is turned off during the period when the inversion flag signal is valid and directly outputs the single-bit address data during the period when the inversion flag signal is invalid.

Figure 7:
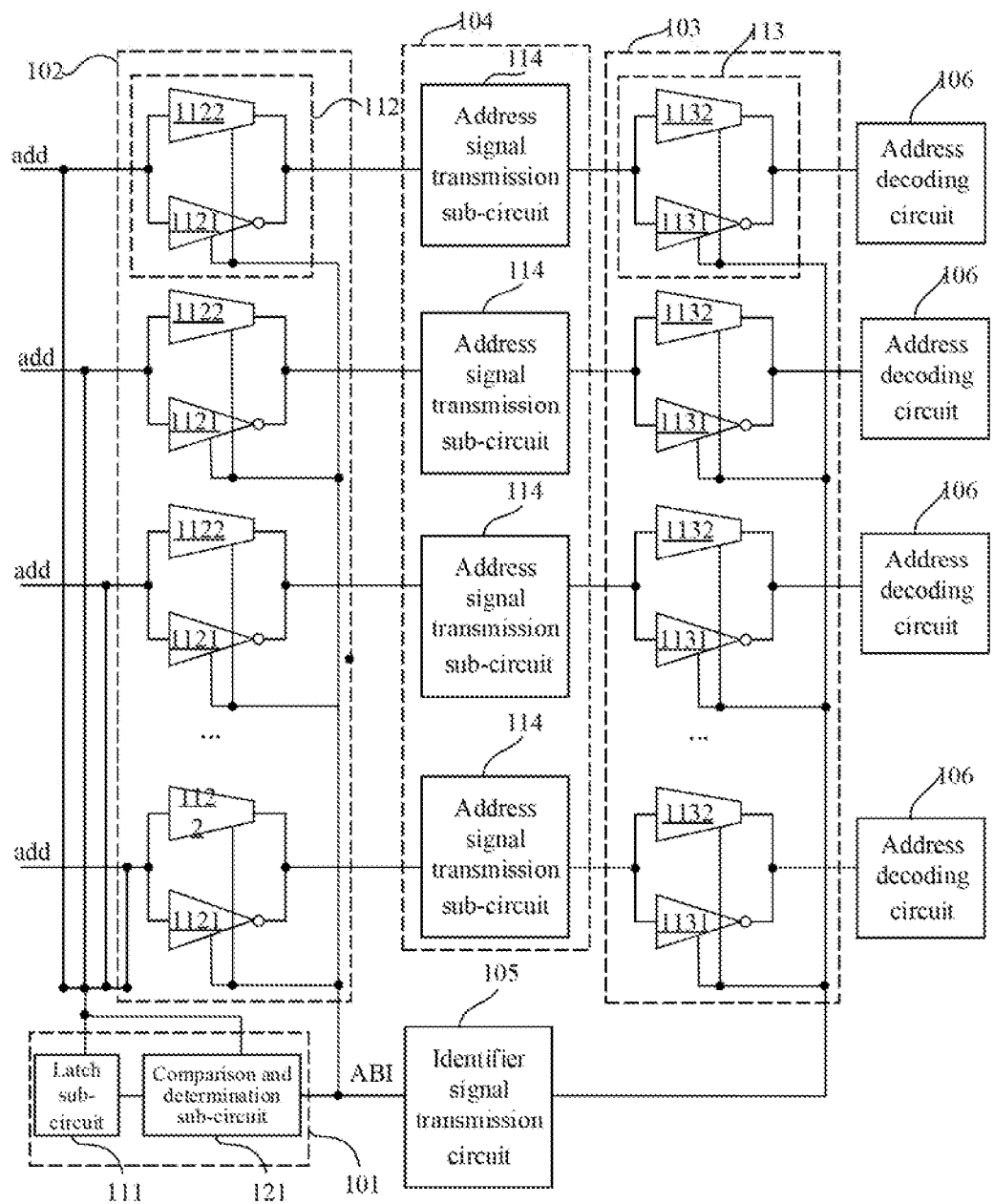
FIG. 7 is another block diagram of an address signal transmission circuit according to an embodiment of the disclosure.

FIG. 7 is another block diagram of an address signal transmission circuit according to an embodiment of the disclosure. Referring to FIG. 7, the address signal transmission circuit further includes: an address receiving circuit 103, where the address receiving circuit 103 is configured to receive the second address signal or the address inverted signal outputted by the selection circuit 102, and in response to the inversion flag signal ABI, output a target address signal. The target address signal is the same as the second address signal received by the selection circuit 101. That is to say, regardless of whether the second address signal has been inverted in the transmission process, the target address signal outputted by the address receiving circuit 103 is the second address signal.

Specifically, in a case where the selection circuit 101 directly outputs the second address signal, the address receiving circuit 103, in response to the invalid inversion flag signal ABI, directly outputs the second address signal. In a case where the selection circuit 101 outputs the address inverted signal, the address receiving signal 103, in response to the valid inversion flag signal ABI, inverts the address inverted signal. Each of the address inverted signals in the address inverted signal is reversed to obtain the second address signal received by the selection circuit 101 and output the second address signal.

Continuously referring to FIG. 7, the address receiving circuit 103 may include: N address receiving sub-circuits 113, each of the address receiving sub-circuits 113 being configured to receive the single-bit address data in the second address signal or the single-bit address inverted data in the address inverted signal, and each of the address receiving sub-circuits 113 being configured to, in response to the inversion flag signal, determine whether the corresponding single-bit address data in the received second address signal or the address inverted signal is to be inverted.

Specifically, the address receiving sub-circuit 113 receives the single-bit address data or the single-bit address inverted data in the address signal outputted by the corresponding selection sub-circuit 112.

In some embodiments, each of the address receiving sub-circuits 113 may include: a second inversion sub-circuit 1131, configured to receive single-bit address inverted data in the address inverted signal, and in response to the inversion flag signal ABI having the first level, invert the single-bit address inverted data to obtain the corresponding single-bit address data, the single-bit address data being the same as the corresponding address data received by the selection circuit 102; and a second transmission sub-circuit 1132, configured to receive the single-bit address data in the second address signal, and in response to the inversion flag signal ABI having the second level, output the single-bit address data.

For specific circuit implementation modes related to the second inversion sub-circuit 1131 and the second transmission sub-circuit 1132, reference may be made to the specific circuit implementation modes of the first inversion sub-circuit 1121 and the first transmission sub-circuit 1122, which is not described in detail herein. It is to be understood that in a case where the first inversion sub-circuit 1121 works, the second inversion sub-circuit 1131 works, and the first transmission sub-circuit 1122 and the second transmission sub-circuit 1132 both are turned off; and in a case where the first inversion sub-circuit 1121 and the second inversion sub-circuit 1131 both are turned off, the first transmission sub-circuit 1122 and the second transmission sub-circuit 1122 both work.

In addition, in order to guarantee that the second inversion sub-circuit 1131 and the second transmission sub-circuit 1132 operate in response to the inversion flag signal ABI corresponding to the second address signal, the address receiving circuit 103 is configured to, prior to receiving the second address signal or the address inverted signal, receive the inversion flag signal ABI first, thereby contributing to further guaranteeing the accuracy of address data transmission.

Referring to FIG. 7, the address signal transmission circuit may further include: an address signal transmission sub-circuit 104, connected between the selection circuit 102 and the receiving circuit 103, and configured to transmit the second address signal or the address inverted signal; and an identifier signal transmission circuit 105, connected between the transmission control circuit 101 and the address receiving circuit 103, and configured to transmit the inversion flag signal ABI.

Specifically, the address signal transmission sub-circuit 104 includes N address signal transmission sub-circuits 114, and each of the address signal transmission sub-circuits 114 is configured to transmit the corresponding single-bit address signal or single-bit address inverted data.

Figure 8:
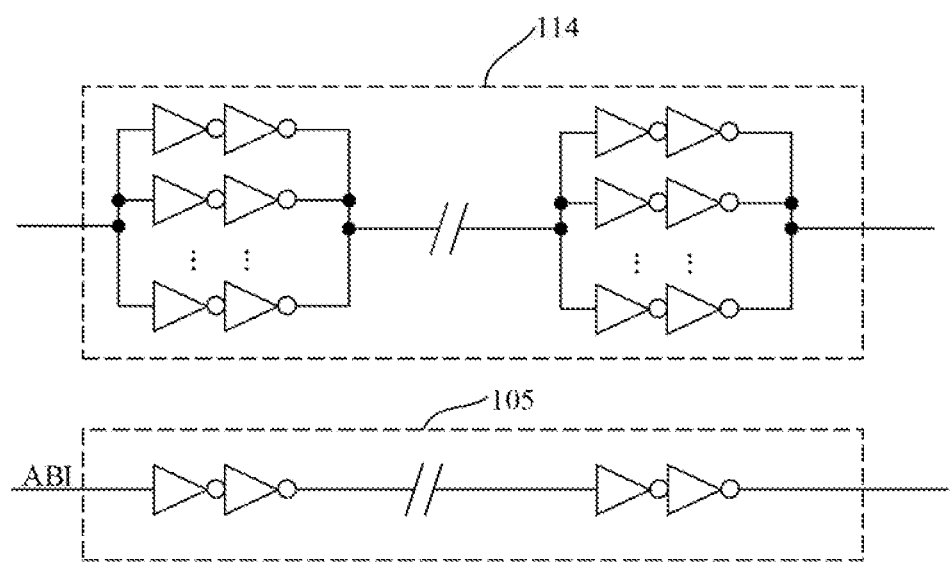
FIG. 8 is another schematic structural diagram of an address signal transmission sub-circuit and an identifier signal transmission circuit in an address signal transmission circuit according to an embodiment of the disclosure.

FIG. 8 is another schematic structural diagram of an address signal transmission sub-circuit and an identifier signal transmission circuit in an address signal transmission circuit according to an embodiment of the disclosure. In some embodiments, referring to FIG. 8, the address signal transmission sub-circuit 114 may include multiple first gate level circuits and may further include a first driving circuit, and the first gate level circuit may include an inverter. The identifier signal transmission circuit 105 may include multiple second gate level circuits and may further include a second driving circuit, and the second gate level circuit may include an inverter. The transmission rate of the identifier signal transmission circuit 105 may be different from that of the address signal transmission sub-circuit 114, which contributes to guaranteeing that the inversion flag signal ABI antecedent to the second address signal/the address inverted signal arrives at the address receiving circuit 103, such that the address receiving circuit 103, in response to the inversion flag signal ABI, makes corresponding circuit adjustment and then receives the second address signal or the address inverted signal, or the inversion flag signal ABI and the second address signal/the address inverted signal arrive at the address receiving circuit 103 simultaneously, such that an address receiving error as the arrival times of the second address signal and the inversion flag signal ABI are inconsistent is avoided. Specifically, the corresponding circuit adjustment refers to that in a case where the selection circuit 102 outputs the second address signal, the address receiving circuit 103, in response to the invalid inversion flag signal ABI, enables the second transmission sub-circuit 1132 to be turned on and the second inversion sub-circuit 1131 to be turned off; and in a case where the selection circuit 102 outputs the address inverted signal, the address receiving circuit 103, in response to the valid inversion flag signal ABI, enables the second inversion sub-circuit 1131 to be turned on and the second transmission sub-circuit 1132 to be turned off.

The address signal transmission sub-circuit 114 includes the circuits that transmit data "0" and "1". In a case where the address data transmitted in the previous time is different from the currently transmitted address data, the address signal transmission sub-circuit 114 needs to invert the circuits so as to switch the circuits that transmits data "0" and "1", and the action of inverting the circuits would bring about high transmission power consumption. Specifically, the first gate level circuit and the first driving circuit may need to invert the level, which would bring about a large inverting current, thereby leading to high transmission power consumption. In the embodiments of the disclosure, in a case where the number of the address wires add with changed address data transmitted successively in the address bus ADD (the number of the address wires add with changed address data is defined as m, i.e., the number of changed bits is m) is greater than or equal to the predetermined value, i.e., the aforementioned number of changed bits (m) is greater than or equal to the predetermined value, all address data in the address signal are reversed, such that the number n of the address signal transmission sub-circuits 114 needed to invert the circuits is N-m, where m is greater than or equal to N/2+a, and a is greater than or equal to 1 but smaller than or equal to N/2; in a case where the number of changed bits is greater than or equal to the predetermined value and the address data in the address signal is not inverted, i.e., not reversed, the number n0 of the address signal transmission sub-circuits needed to invert the circuits is m. It could be known from this that in the embodiments of the disclosure, in a case where the number of changed bits is greater than or equal to the predetermined value, the number of the address signal transmission sub-circuits 114 needed to invert the circuits is decreased by 2 a, such that the power consumption of the signal transmission circuit 104 that transmits the address signal is reduced.

Referring to FIG. 7, the address signal transmission circuit may further include an address decoding circuit 106, connected to the output end of the address receiving circuit 103, and configured to perform address decoding processing on the target address signal.

The address decoding circuit 106 performs corresponding operation based on the received target address signal. For example, in a case where the address signal indicates a word line, the corresponding word line is selected according to the target address signal; in a case where the address signal indicates a bit line, the corresponding bit line is selected according to the target address signal; and in a case where the address signal indicates a storage area, the corresponding storage area is selected according to the target address signal.

Figure 9:
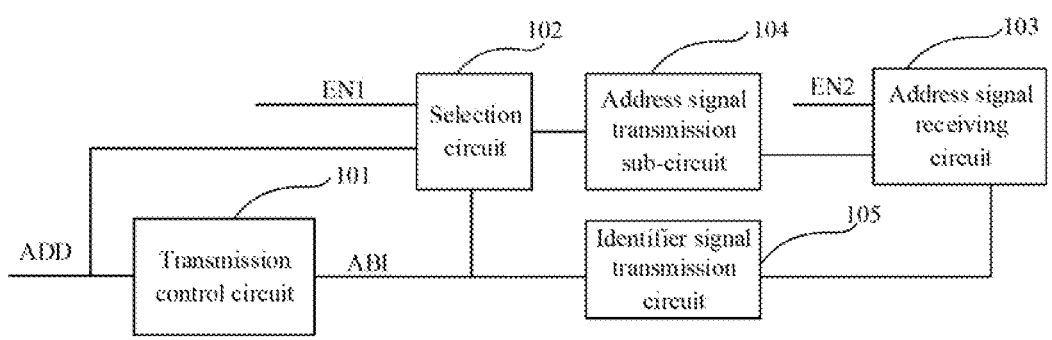
FIG. 9 is another block diagram of an address signal transmission circuit according to an embodiment of the disclosure.

FIG. 9 is another block diagram of an address signal transmission circuit according to an embodiment of the disclosure. In some embodiments, referring to FIG. 9, the selection circuit 102 may, in response to a first enable control signal EN1, receive the second address signal, and the address receiving circuit 103 may, in response to a second enable control signal EN2, receive the second address signal. Specifically, after the second address signal and the inversion flag signal ABI corresponding to the second address signal arrive at the selection circuit 102, the selection circuit 102, in response to the valid first enable control signal EN1, works normally, i.e., the selection circuit 102 correspondingly inverts the second address signal or directly outputs the second address signal during the period when the first enable control signal EN1 is valid based on whether the inversion flag signal ABI is valid or invalid. After one of the second address signal or the address inverted signal and the inversion flag signal ABI arrive at the address receiving circuit 103, the address receiving circuit 103, in response to the valid second enable control signal EN2, works normally, i.e., the address receiving circuit 103 correspondingly inverts the address inverted signal to obtain the target address signal or directly outputs the second address signal during the period when the second enable control signal EN2 is valid based on whether the inversion flag signal ABI is valid or invalid. Thus, it contributes to further guaranteeing the correctness of address data transmission.

Specifically, jointly referring to FIG. 3 and FIG. 9, the first inversion sub-circuit 1121 and/or the first transmission sub-circuit 1122 may further, in response to the first enable control signal EN1, work normally. The first inversion sub-circuit 1121 works normally, which refers to that after the valid inversion flag signal ABI and the valid first enable control signal EN1 arrive at the first inversion sub-circuit 1121, the first inversion sub-circuit 1121 would invert the second address signal. The first transmission sub-circuit 1122 works normally, which refers to that after the invalid inversion flag signal ABI and the valid first enable control signal EN1 arrive at the first transmission sub-circuit 122, the first transmission sub-circuit 1122 would directly output the second address signal.

Jointly referring to FIG. 7 and FIG. 9, the second inversion sub-circuit 1131 and/or the second transmission sub-circuit 1132 may further, in response to the second enable control signal EN2, work normally. The second inversion sub-circuit 1131 works normally, which refers to that after the valid inversion flag signal ABI and the valid second enable control signal EN2 arrive at the second inversion sub-circuit 1131, the second inversion sub-circuit 1131 would invert the address inverted signal. The second transmission sub-circuit 1132 works normally, which refers to that after the invalid inversion flag signal ABI and the valid second enable control signal EN2 arrive at the second transmission sub-circuit 1132, the second transmission sub-circuit 1132 would directly output the second address signal.

The address signal transmission circuit may further include an address register where the address signal is registered. In a case where it is needed to use the address signal, the address signal in the address register is transmitted to the address bus, such that the address bus continuously transmits the address signal.

It would be known from above analysis that the address signal transmission circuit at least contributes to reducing the power consumption of address signal transmission.

Figure 10:
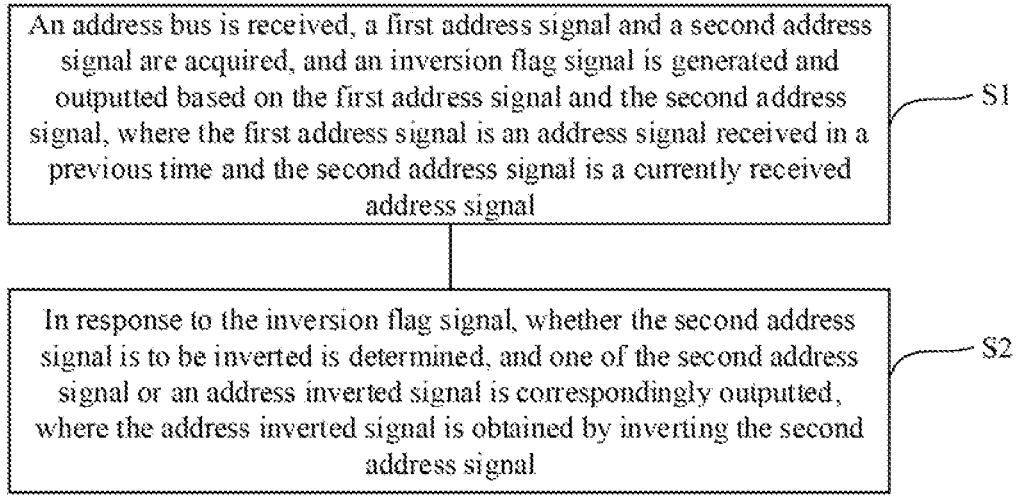
FIG. 10 is a flowchart of an address signal transmission method according to an embodiment of the disclosure.
Figure 11:
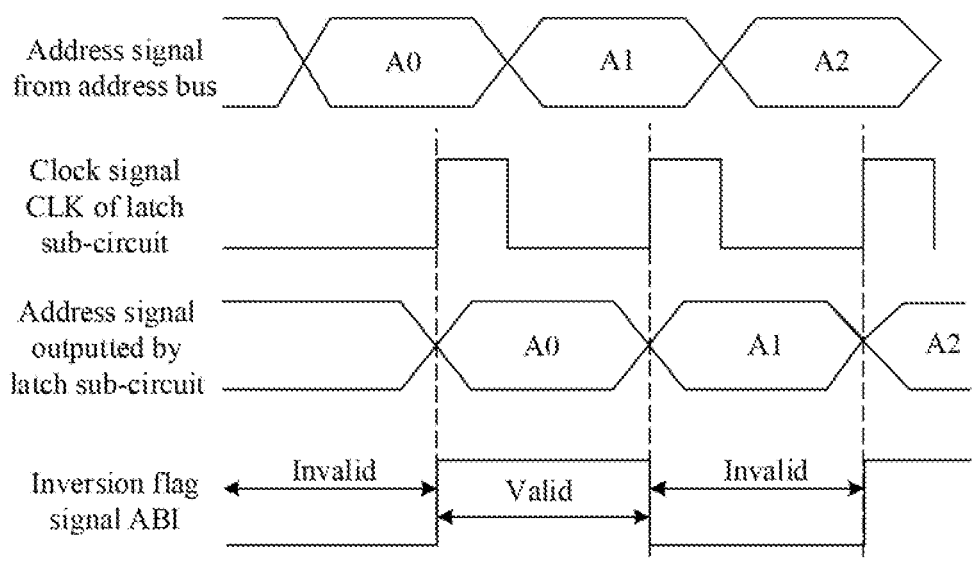
FIG. 11 is a sequence chart of signals in an address signal transmission method according to an embodiment of the disclosure.

Correspondingly, the embodiments of the disclosure further provide an address signal transmission method, which may be implemented by using the address signal transmission circuit provided by the above-mentioned embodiments. The address signal transmission method provided by the embodiments of the disclosure will be described in detail below, and description in the above-mentioned embodiments is also applicable to the embodiments of the address signal transmission method. FIG. 10 is a flowchart of an address signal transmission method according to an embodiment of the disclosure. FIG. 11 is a sequence chart of signals in an address signal transmission method according to an embodiment of the disclosure.

Referring to FIG. 10, S1 includes: an address bus is received, a first address signal and a second address signal are acquired, and an inversion flag signal is generated and outputted based on the first address signal and the second address signal. The first address signal is an address signal received in a previous time and the second address signal is a currently received address signal.

The inversion flag signal may be generated based on the difference between the first address signal and the second address signal. Thus, the generated inversion flag signal may be flexibly selected according to different demands, such that different demands are met in the address signal transmission process. The different demands may be small transmission power consumption, high transmission rate or high transmission correctness and the like.

In some embodiments, the method that generates and outputs an inversion flag signal based on the first address signal and the second address signal may include: a number of changed bits of address data in the first address signal and the second address signal are acquired and the inversion flag signal is generated based on a relation between the number of changed bits and a predetermined value. The number of changed bits of the address data is N, and the predetermined value satisfies M=N/2+1, M being the predetermined value and N being a positive integer.

Specifically, address data in the address signal may be transmitted in a parallel mode. For description of the inversion flag signal, reference may be made on detailed description of the aforementioned embodiments, which will not be described in detail herein.

Continuously referring to FIG. 10, S2 includes: in response to the inversion flag signal, whether the second address signal is to be inverted is determined, and one of the second address signal or an address inverted signal is correspondingly outputted. The address inverted signal is obtained by inverting the second address signal.

The inversion flag signal includes two states: invalid and valid. In a case where the inversion flag signal is valid, the second address signal would be inverted in the address signal transmission process to obtain the address inverted signal, and the address inverted signal is continuously transmitted; in a case where the inversion flag signal is invalid, the second address signal would be directly transmitted in the address signal transmission process.

In some embodiments, the operation that in response to the inversion flag signal, whether the second address signal is to be inverted is determined may include: in a case where the number of changed bits is greater than or equal to the predetermined value, in response to the inversion flag signal, the second address signal is inverted to obtain the address inverted signal, and the address inverted signal is outputted; and in a case where the number of changed bits is smaller than the predetermined value, in response to the inversion flag signal, the second address signal is outputted. Specifically, as shown in FIG. 11, it shows the sequence diagram of the address signal (i.e., the second address signal) from the address bus, the address signal (i.e., the first address signal) outputted by the latch sub-circuit and the inversion flag signal ABI. It is to be understood that the address signal outputted by the latch sub-circuit at the same time is the address signal provided by the address bus in the previous time. By taking a situation that the latch sub-circuit triggered by the rising edge of the clock signal CLK outputs the first address signal as an example, FIG. 11 further shows the sequence diagram of the clock signal CLK of the latch sub-circuit. The address bus successively transmits the address signals A0, A1 and A2. Compared with A0, in a case where the number of changed bits of the address data of A1 is greater than or equal to the predetermined value, the corresponding inversion flag signal ABI is valid. Compared with A1, in a case where the number of changed bits of the address data of A2 is smaller than the predetermined value, the corresponding inversion flag signal ABI is invalid. By taking a situation that A0, A1 and A2 are Add [7:0] as an example, compared with A0, the number of changed bits of the address data of A1 is greater than or equal to 5, and compared with A1, the number of changed bits of the address data of A2 is smaller than 5.

Since the currently received address signal (i.e., the second address signal) is inverted to obtain the address inverted signal, compared with the address signal (i.e., the first address signal) transmitted in the previous time, the address inverted signal has an actual number of changed bits which is smaller than the previously obtained number of changed bits. Therefore, in a transmission path where the address inverted signal is continuously transmitted, compared with direct transmission of the second address signal, the number of the transmission paths of the inverting circuits needed to be inverted in the embodiments of the disclosure is decreased, which contributes to reducing the power consumption of address signal transmission.

It is to be understood that in a case where the second address signal needs to be used actually, the address inverted signal may be reversed again, so as to obtain the target address signal. For example, at the tail end of the transmission path of the address signal, in response to the valid inversion flag signal, the address inverted signal may be inverted to obtain the target address signal. The target address signal is the same as the second address signal received by the selection circuit.

Correspondingly, the embodiments of the disclosure further provide a storage system, which may include the address signal transmission circuit provided by the aforementioned embodiments of the disclosure.

The storage system is a DRAM storage system, for example, a DDR5 DRAM storage system or a DDR4 DRAM storage system. In other embodiments, the storage system may further be the SRAM storage system, the SDRAM storage system, the ROM storage system or the flash memory storage system.

The storage system includes memory cell arrays. Each of the memory cell arrays may include a plurality of storage areas. Each of the storage areas may include 2X word lines. Each of the memory cell arrays may include 2Y bit lines. The address signal transmitted by the address bus may represent a storage area address, a row address or a column address, that is to say, the storage area for performing store operation may be indicated by the address signal, the selected row address (i.e., selected word line) may be indicated by the address signal, and the selected column address (i.e., selected bit line) may be indicated by the address signal.

It would be known from above analysis that the storage system provided by the embodiments of the disclosure may save the power consumption of address signal transmission.

Those of ordinary skill in the art can understand that each of the above-mentioned implementation modes is a specific embodiment for implementing the application, and that in practical applications, variations about the form and details can be made thereto without departing from the spirit and scope of the disclosure. Those skilled in the art may implement respective variations and modifications without departing from the spirit and scope of the disclosure, and thus the scope of protection of the disclosure should be subject to the scope defined by the claims.

What is claimed is:

1. An address signal transmission circuit, comprising:
    a transmission control circuit, connected to an address bus, configured to receive address signals from the address bus, acquire a first address signal and a second address signal, and generate and output an inversion flag signal based on the first address signal and the second address signal, wherein the first address signal is an address signal received in a previous time and the second address signal is a currently received address signal; and
    a selection circuit, connected to the address bus, configured to receive the address signals from the address bus, determine, in response to the inversion flag signal, whether the second address signal is to be inverted, and correspondingly output one of the second address signal or an address inverted signal, wherein the selection circuit inverts the second address signal to obtain the address inverted signal;
    wherein the transmission control circuit is further configured to acquire a number of changed bits of address data in the first address signal and the second address signal and generate the inversion flag signal based on a relation between the number of changed bits and a predetermined value, wherein the number of changed bits of the address data is N, and the predetermined value satisfies M=N/2+1, M being the predetermined value and N being a positive integer; and
    the selection circuit is further configured to, in a case where the number of changed bits is greater than or equal to the predetermined value, invert the second address signal to obtain the address inverted signal and output the address inverted signal, and in a case where the number of changed bits is smaller than the predetermined value, directly output the second address signal;
    wherein the transmission control circuit comprises:
    a latch sub-circuit, connected to the address bus, and configured to latch and output a received address signal; and
    a comparison and determination sub-circuit, connected to the address bus and configured to acquire the second address signal, connected to the latch sub-circuit and configured to acquire the first address signal latched in the previous time, wherein the comparison and determination sub-circuit is configured to acquire the number of changed bits according to the first address signal and the second address signal, and compare the number of changed bits with the predetermined value to generate the inversion flag signal.

2. The address signal transmission circuit of claim 1, wherein the latch sub-circuit comprises a latch, configured to latch and output the received address signal; and the transmission control circuit further comprises a delay sub-circuit, connected between the address bus and the latch, and configured to control a time when the address signal on the address bus is transmitted to the latch.

3. The address signal transmission circuit of claim 1, wherein the latch sub-circuit comprises a register, a clock control end of the register being configured to receive a clock signal, and the register being connected to the address bus and configured to, in response to a trigger edge of the clock signal, latch and output the received address signal.

4. The address signal transmission circuit of claim 1, wherein the comparison and determination sub-circuit comprises:
    a first comparison sub-circuit, connected to the address bus and the latch sub-circuit, and configured to acquire the number of changed bits; and
    a second comparison sub-circuit, connected to the first comparison sub-circuit, and configured to receive the number of changed bits, compare the number of changed bits with the predetermined value, and generate the inversion flag signal.

5. The address signal transmission circuit of claim 1, wherein
    in a case where the number of changed bits is greater than or equal to the predetermined value, the comparison and determination sub-circuit generates the inversion flag signal having a first level; and in a case where the number of changed bits is smaller than the predetermined value, the comparison and determination sub-circuit generates an inversion flag signal having a second level, wherein the inversion flag signal having the first level is valid and the inversion flag signal having the second level is invalid.

6. The address signal transmission circuit of claim 5, wherein
the selection circuit is configured to, in response to the inversion flag signal having the first level, invert the second address signal to obtain the address inverted signal, and output the address inverted signal; and
the selection circuit is configured to, in response to inversion flag signal having the second level, directly output the second address signal.

7. The address signal transmission circuit of claim 6, wherein the selection circuit comprises N selection sub-circuits, each of the selection sub-circuits being configured to receive single-bit address data in the second address signal, each of the selection sub-circuits being connected to the transmission control circuit, and each of the selection sub-circuits being configured to, in response to the inversion flag signal, determine whether the corresponding single-bit address signal in the second address signal is to be inverted.

8. The address signal transmission circuit of claim 7, wherein each of the selection sub-circuits comprises:
a first inversion sub-circuit, configured to receive the corresponding single-bit address data in the second address signal, and in response to the inversion flag signal having the first level, invert the single-bit address data to obtain single-bit address inverted data, and output the single-bit address inverted data; and
a first transmission sub-circuit, configured to receive the single-bit address data, and in response to the inversion flag signal having the second level, output the single-bit address data.

9. The address signal transmission circuit of claim 8, wherein the first inversion sub-circuit comprises:
a first switch and a first inverter, the first switch being connected between the address bus and an input end of the first inverter, wherein the first switch is configured to be turned on in response to the inversion flag signal having the first level, and to be turned off in response to the inversion flag signal having the second level.

10. The address signal transmission circuit of claim 8, wherein the first inversion sub-circuit comprises:
the first switch and the first inverter, the first switch being connected to an output end of the first inverter, the input end of the first inverter being connected to the address bus,
wherein the first switch is configured to be turned on in response to the inversion flag signal having the first level, and to be turned off in response to the inversion flag signal having the second level.

11. The address signal transmission circuit of claim 8, wherein the first transmission sub-circuit comprises:
a first transmission gate, an input end of the first transmission gate receiving the single-bit address data, and a control end thereof receiving the inversion flag signal;
wherein the first transmission gate is configured to be turned off in response to the inversion flag signal having the first level, and to be turned on in responses to the inversion flag signal having the second level, so as to output the single-bit address data.

12. The address signal transmission circuit of claim 1, further comprising:
a delay circuit, the delay circuit being connected between the selection circuit and the address bus, and configured to control the time when the second address signal is transmitted to the selection circuit, such that the selection circuit, prior to receiving the second address signal, receives the inversion flag signal.

13. The address signal transmission circuit of claim 1, further comprising an address receiving circuit, wherein the address receiving circuit is configured to receive the second address signal or the address inverted signal outputted by the selection circuit, and in response to the inversion flag signal, output a target address signal, wherein the target address signal is the same as the second address signal received by the selection circuit.

14. The address signal transmission circuit of claim 13, wherein the address receiving circuit comprises N address receiving sub-circuits, each of the address receiving sub-circuits being configured to receive the single-bit address data in the second address signal or the single-bit address inverted data in the address inverted signal, and each of the address receiving sub-circuits being configured to, in response to the inversion flag signal, determine whether the corresponding single-bit address data in the received second address signal or the address inverted signal is to be inverted.

15. The address signal transmission circuit of claim 14, wherein each of the address receiving sub-circuits comprises:
a second inversion sub-circuit, configured to receive single-bit address inverted data in the address inverted signal, and in response to the inversion flag signal having the first level, invert the single-bit address inverted data to obtain the corresponding single-bit address data; and
a second transmission sub-circuit, configured to receive the single-bit address data in the second address signal, and in response to the inversion flag signal having the second level, output the single-bit address data.

16. The address signal transmission circuit of claim 13, wherein the selection circuit is configured to, in response to a first enable control signal, receive the second address signal, and the address receiving circuit is configured to, in response to a second enable control signal, receive the second address signal; or,
wherein the address signal transmission circuit further comprises:
an address decoding circuit, connected to the output end of the address receiving circuit, and configured to perform address decoding processing on the target address signal; or,
an address signal transmission sub-circuit, connected between the selection circuit and the address receiving circuit, and configured to transmit the second address signal or the address inverted signal; and an identifier signal transmission circuit, connected between the transmission control circuit and the address receiving circuit, and configured to transmit the address inverted signal.

17. A storage system, comprising an address signal transmission circuit, wherein the address signal transmission circuit comprises:
a transmission control circuit, connected to an address bus, configured to receive address signals from the address bus, acquire a first address signal and a second address signal, and generate and output an inversion flag signal based on the first address signal and the second address signal, wherein the first address signal is an address signal received in a previous time and the second address signal is a currently received address signal; and a selection circuit, connected to the address bus, configured to receive the address signals from the address bus, determine, in response to the inversion flag signal, whether the second address signal is to be inverted, and correspondingly output one of the second address signal or an address inverted signal, wherein the selection circuit inverts the second address signal to obtain the address inverted signal;

wherein the transmission control circuit is further configured to acquire a number of changed bits of address data in the first address signal and the second address signal and generate the inversion flag signal based on a relation between the number of changed bits and a predetermined value, wherein the number of changed bits of the address data is N, and the predetermined value satisfies M=N/2+1, M being the predetermined value and N being a positive integer; and the selection circuit is further configured to, in a case where the number of changed bits is greater than or equal to the predetermined value, invert the second address signal to obtain the address inverted signal and output the address inverted signal, and in a case where the number of changed bits is smaller than the predetermined value, directly output the second address signal;

wherein the transmission control circuit comprises:

a latch sub-circuit, connected to the address bus, and configured to latch and output a received address signal; and a comparison and determination sub-circuit, connected to the address bus and configured to acquire the second address signal, connected to the latch sub-circuit and configured to acquire the first address signal latched in the previous time, wherein the comparison and determination sub-circuit is configured to acquire the number of changed bits according to the first address signal and the second address signal, and compare the number of changed bits with the predetermined value to generate the inversion flag signal.

18. An address signal transmission circuit, comprising:

a transmission control circuit, connected to an address bus, configured to receive address signals from the address bus, acquire a first address signal and a second address signal, and generate and output an inversion flag signal based on the first address signal and the second address signal, wherein the first address signal is an address signal received in a previous time and the second address signal is a currently received address signal; and a selection circuit, connected to the address bus, configured to receive the address signals from the address bus, determine, in response to the inversion flag signal, whether the second address signal is to be inverted, and correspondingly output one of the second address signal or an address inverted signal, wherein the selection circuit inverts the second address signal to obtain the address inverted signal;

a delay circuit, the delay circuit being connected between the selection circuit and the address bus, and configured to control the time when the second address signal is transmitted to the selection circuit, such that the selection circuit, prior to receiving the second address signal, receives the inversion flag signal.

19. An address signal transmission circuit, comprising:

a transmission control circuit, connected to an address bus, configured to receive address signals from the address bus, acquire a first address signal and a second address signal, and generate and output an inversion flag signal based on the first address signal and the second address signal, wherein the first address signal is an address signal received in a previous time and the second address signal is a currently received address signal; and a selection circuit, connected to the address bus, configured to receive the address signals from the address bus, determine, in response to the inversion flag signal, whether the second address signal is to be inverted, and correspondingly output one of the second address signal or an address inverted signal, wherein the selection circuit inverts the second address signal to obtain the address inverted signal;

an address receiving circuit, wherein the address receiving circuit is configured to receive the second address signal or the address inverted signal outputted by the selection circuit, and in response to the inversion flag signal, output a target address signal, wherein the target address signal is the same as the second address signal received by the selection circuit;

wherein the selection circuit is configured to, in response to a first enable control signal, receive the second address signal, and the address receiving circuit is configured to, in response to a second enable control signal, receive the second address signal; or, wherein the address signal transmission circuit further comprises:

an address decoding circuit, connected to the output end of the address receiving circuit, and configured to perform address decoding processing on the target address signal; or, an address signal transmission sub-circuit, connected between the selection circuit and the address receiving circuit, and configured to transmit the second address signal or the address inverted signal; and an identifier signal transmission circuit, connected between the transmission control circuit and the address receiving circuit, and configured to transmit the address inverted signal.

20. An address signal transmission circuit, comprising:

a transmission control circuit, connected to an address bus, configured to receive address signals from the address bus, acquire a first address signal and a second address signal, and generate and output an inversion flag signal based on the first address signal and the second address signal, wherein the first address signal is an address signal received in a previous time and the second address signal is a currently received address signal; and a selection circuit, connected to the address bus, configured to receive the address signals from the address bus, determine, in response to the inversion flag signal, whether the second address signal is to be inverted, and correspondingly output one of the second address signal or an address inverted signal, wherein the selection circuit inverts the second address signal to obtain the address inverted signal;

an address receiving circuit, wherein the address receiving circuit is configured to receive the second address signal or the address inverted signal outputted by the selection circuit, and in response to the inversion flag signal, output a target address signal, wherein the target address signal is the same as the second address signal received by the selection circuit;

wherein the address receiving circuit comprises N address receiving sub-circuits, each of the address receiving sub-circuits being configured to receive the single-bit address data in the second address signal or the single-bit address inverted data in the address inverted signal, and each of the address receiving sub-circuits being configured to, in response to the inversion flag signal, determine whether the corresponding single-bit address data in the received second address signal or the address inverted signal is to be inverted.

* * * * *